US006831324B2

(12) United States Patent
Sandhu et al.

(10) Patent No.: US 6,831,324 B2
(45) Date of Patent: Dec. 14, 2004

(54) METHOD OF PRODUCING ROUGH POLYSILICON BY THE USE OF PULSED PLASMA CHEMICAL VAPOR DEPOSITION AND PRODUCTS PRODUCED BY THE SAME

(75) Inventors: Gurtej S. Sandhu, Boise, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 10/246,213

(22) Filed: Sep. 18, 2002

(65) Prior Publication Data

US 2003/0020113 A1 Jan. 30, 2003

Related U.S. Application Data

(62) Division of application No. 09/732,624, filed on Dec. 8, 2000, now Pat. No. 6,472,320, which is a continuation of application No. 09/127,159, filed on Jul. 31, 1998, now Pat. No. 6,214,726, which is a division of application No. 08/762,544, filed on Dec. 9, 1996, now Pat. No. 5,849,628.

(51) Int. Cl.[7] .......................................... H01L 27/108
(52) U.S. Cl. ........................ 257/309; 257/296; 257/301
(58) Field of Search .................................. 257/309, 296, 257/301, 303, 308, 306; 438/699, 255, 398, 253, 254, 396, 397, 689, 694, 695, 697, 686, 758, 260

(56) References Cited

U.S. PATENT DOCUMENTS

| 4,824,690 A | | 4/1989 | Heinecke et al. ............... 427/38 |
| 4,935,661 A | | 6/1990 | Heinecke et al. ...... 313/231.31 |
| 5,102,832 A | * | 4/1992 | Tuttle ........................... 438/398 |
| 5,112,773 A | * | 5/1992 | Tuttle ........................... 438/398 |
| 5,192,717 A | | 3/1993 | Kawakami et al. .......... 439/233 |
| 5,242,530 A | | 9/1993 | Batey et al. .................. 156/613 |
| 5,298,290 A | | 3/1994 | Jost et al. ..................... 427/489 |
| 5,320,880 A | | 6/1994 | Sandhu et al. ............... 427/578 |
| 5,342,800 A | | 8/1994 | Jun ................................ 437/52 |
| 5,344,792 A | | 9/1994 | Sandhu et al. ............... 437/200 |
| 5,367,139 A | | 11/1994 | Bennett et al. ......... 219/121.59 |
| 5,372,962 A | | 12/1994 | Hirota et al. ................... 437/47 |
| 5,405,448 A | | 4/1995 | Jost et al. .................. 118/723 E |
| 5,502,315 A | | 3/1996 | Chua et al. ..................... 257/50 |
| 5,622,888 A | | 4/1997 | Sekine et al. ................ 438/398 |
| 5,677,236 A | | 10/1997 | Saitoh et al. ................. 437/109 |
| 5,688,550 A | | 11/1997 | Weimer et al. .................. 427/8 |
| 5,696,014 A | * | 12/1997 | Figura .......................... 438/398 |
| 5,801,104 A | * | 9/1998 | Schuegraf et al. ........... 438/778 |
| 5,830,793 A | * | 11/1998 | Schuegraf et al. ........... 438/255 |
| 5,849,628 A | * | 12/1998 | Sandhu et al. ............... 438/488 |
| 5,851,878 A | * | 12/1998 | Huang .......................... 438/255 |
| 5,888,591 A | | 3/1999 | Gleason et al. .............. 427/522 |
| 6,008,086 A | * | 12/1999 | Schuegraf et al. ........... 438/255 |
| 6,242,356 B1 | * | 6/2001 | Jang et al. .................... 438/699 |
| 6,399,983 B1 | * | 6/2002 | Ping et al. .................... 257/309 |
| 6,429,127 B1 | * | 8/2002 | Derderian et al. ........... 438/686 |
| 6,521,515 B1 | * | 2/2003 | Kluth ............................ 438/486 |

OTHER PUBLICATIONS

Y. Watanabe et al., "Powder–free plasma chemical vapor deposition of hydrogenated amorphous silicon with high rf power density using modulated rf discharge," Appl. Phys. Lett. 57(16) Oct. 15, 1990, American Institute of Physics, pp. 1616–1618.

A, Lloret et al., "Ellipsometric study of a–Si:H thin films deposited by square wave modulated rf glow discharge," J. Appl. Phys. 69 (2), Jan. 15, 1991, American Institute of Physics, pp. 632638.

G. Sandhu et al., "Pulsed–Plasma Enhanced Chemical Vapor Deposition For Low Temperature Deposition Of Titanium Silicde," Advanced Metallization for ULSI Applications 1992, pp. 287–293.

* cited by examiner

*Primary Examiner*—Carl Whitehead, Jr.
*Assistant Examiner*—Laura M Schillinger
(74) *Attorney, Agent, or Firm*—Fletcher Yoder

(57) ABSTRACT

A method for depositing a rough polysilicon film on a substrate is disclosed. The method includes introducing the reactant gases argon and silane into a deposition chamber and enabling and disabling a plasma at various times during the deposition process.

4 Claims, 4 Drawing Sheets

METHOD OF PRODUCING ROUGH POLYSILICON BY THE USE OF PULSED PLASMA CHEMICAL VAPOR DEPOSITION AND PRODUCTS PRODUCED BY THE SAME

This application is a Divisional of application Ser. No. 09/732,624, filed on Dec. 8, 2000 now U.S. Pat. No. 6,472,320 which is a Continuation of application Ser. No. 09/127,159, filed on Jul. 31, 1998 now U.S. Pat. No. 6,214,726 which is a Divisional of application Ser. No. 08/762,544, filed on Dec. 9, 1996 which issued on Dec. 15, 1998 as U.S. Pat. No. 5,849,628.

BACKGROUND OF THE INVENTION

1. Field of the Invention

This invention relates generally to the field of integrated circuit manufacturing and, more particularly, to a method for forming a rough polysilicon film.

2. Description of the Related Art

In semiconductor manufacturing, it is sometimes desirable to deposit polysilicon film on a substrate in such a way that rough polysilicon results. In dynamic random access memory (DRAM) technologies, for instance, it may be desirable to manufacture a memory cell capacitor using rough polysilicon.

A capacitor having a given lateral area manufactured with a rough polysilicon plate will have a higher capacitance than a capacitor of having the same lateral area manufactured with a smooth plate. The rough polysilicon capacitor has a larger effective dielectric surface area due to the folding of the capacitor dielectric over the rough film. When used in a DRAM memory cell, the larger dielectric surface area increases the memory cell's capacitance and improves the cell's charge storage characteristics, thereby improving product performance.

Unfortunately, the use of traditional manufacturing methods to produce rough polysilicon have been generally unsatisfactory because of the widely varying roughness they produce. The instant process results in a more reliable rough polysilicon film that is more easily controlled. Moreover, because the instant process uses etchants and techniques common to the semiconductor industry, this improved process can be readily integrated into modern day manufacturing flows.

SUMMARY OF THE INVENTION

In accordance with one aspect of the present invention, there is provided a method for depositing a rough polysilicon film on a substrate. The method includes the steps of introducing reactant gas into a deposition chamber containing the substrate, and enabling and disabling a plasma within the deposition chamber.

In accordance with another aspect of the present invention, there is provided a method for manufacturing a capacitor having a plate formed of rough polysilicon. The plate is formed by introducing reactant gas into a deposition chamber containing the substrate and selectively and repeatedly enabling and disabling a plasma to deposit the rough polysilicon on the substrate. A dielectric layer is formed on the rough polysilicon, and a conductive plate is formed on the dielectric layer.

In accordance with a further aspect of the present invention, there is provided a capacitor that includes a polysilicon plate formed by introducing reactant gases into a deposition chamber and selectively and repeatedly enabling and disabling a plasma at various times during the deposition process. A dielectric film is disposed on the polysilicon plate, and a top plate is disposed on the dielectric film.

In accordance with yet another aspect of the present invention, there is provided a memory circuit that includes a plurality of memory cells. Each of the memory cells has a capacitor. Each capacitor has a plate of rough polysilicon formed by introducing reactant gas into a deposition chamber and selectively and repeatedly enabling and disabling a plasma at various times during the deposition process.

In accordance with a still further aspect of the present invention, there is provided a method for depositing a rough polysilicon film on a substrate. The method includes the steps of: (a) placing a substrate in a deposition chamber; (b) introducing reactant gas into said deposition chamber; (c) creating a plasma; (d) disabling said plasma; (e) pumping a portion of reactive by-products out of said deposition chamber; and (f) repeating steps (c), (d), and (e) until a roughened polysilicon film has been deposited on said substrate.

BRIEF DESCRIPTION OF THE DRAWINGS

The foregoing and other advantages of the invention will become apparent upon reading the following detailed description and upon reference to the drawings in which.

Figure 1A:
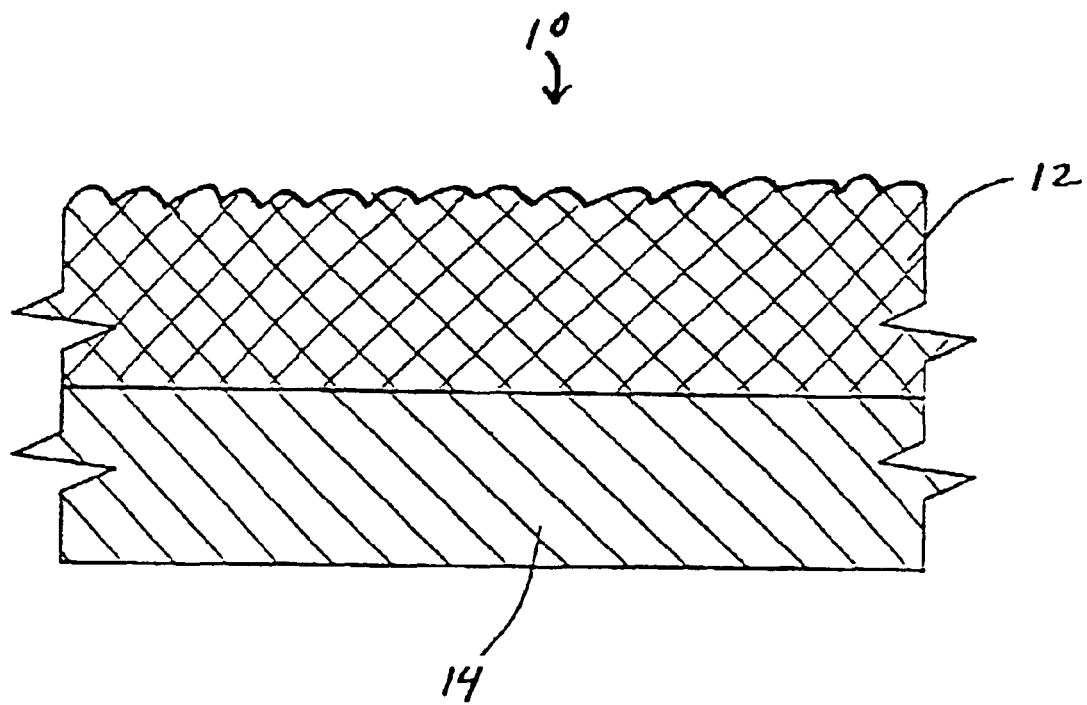
FIG. 1A is a cross-section of a bottom plate of a capacitor comprised of rough polysilicon.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DESCRIPTION OF SPECIFIC EMBODIMENTS

Figure 1B:
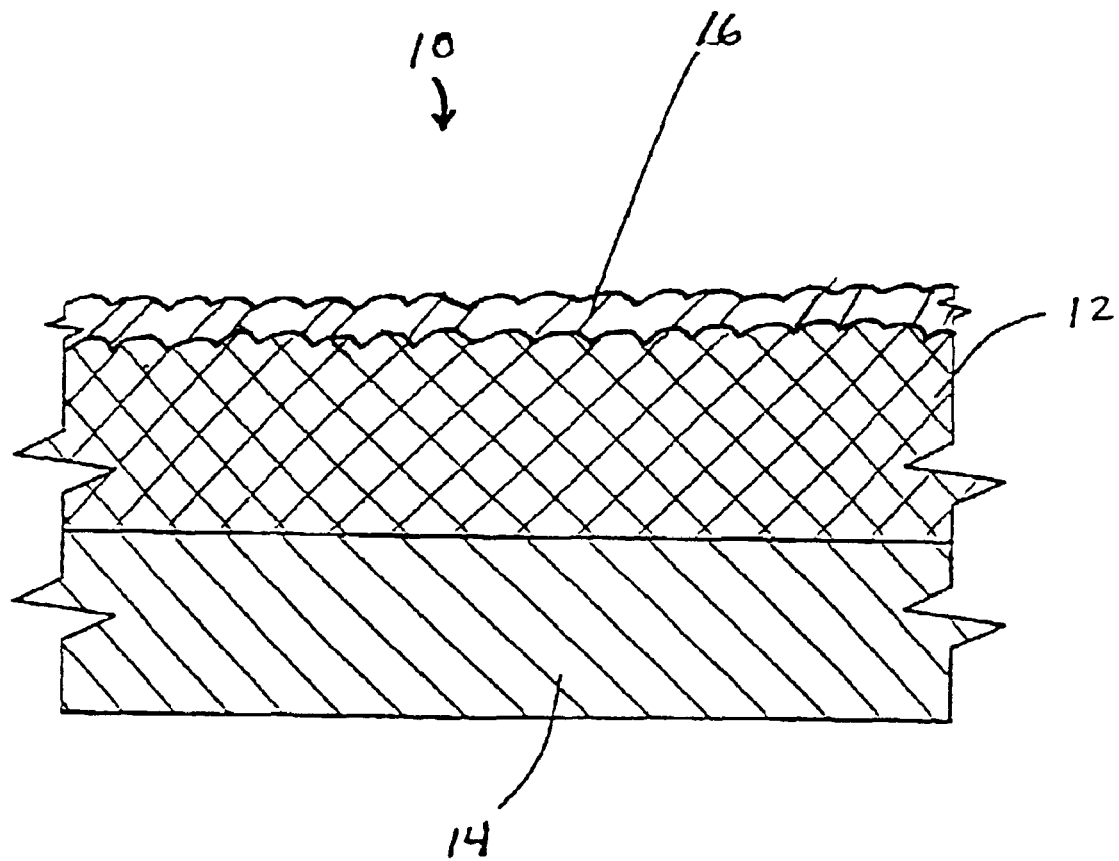
FIG. 1B shows the addition of a capacitor dielectric over the rough polysilicon film.
Figure 1C:
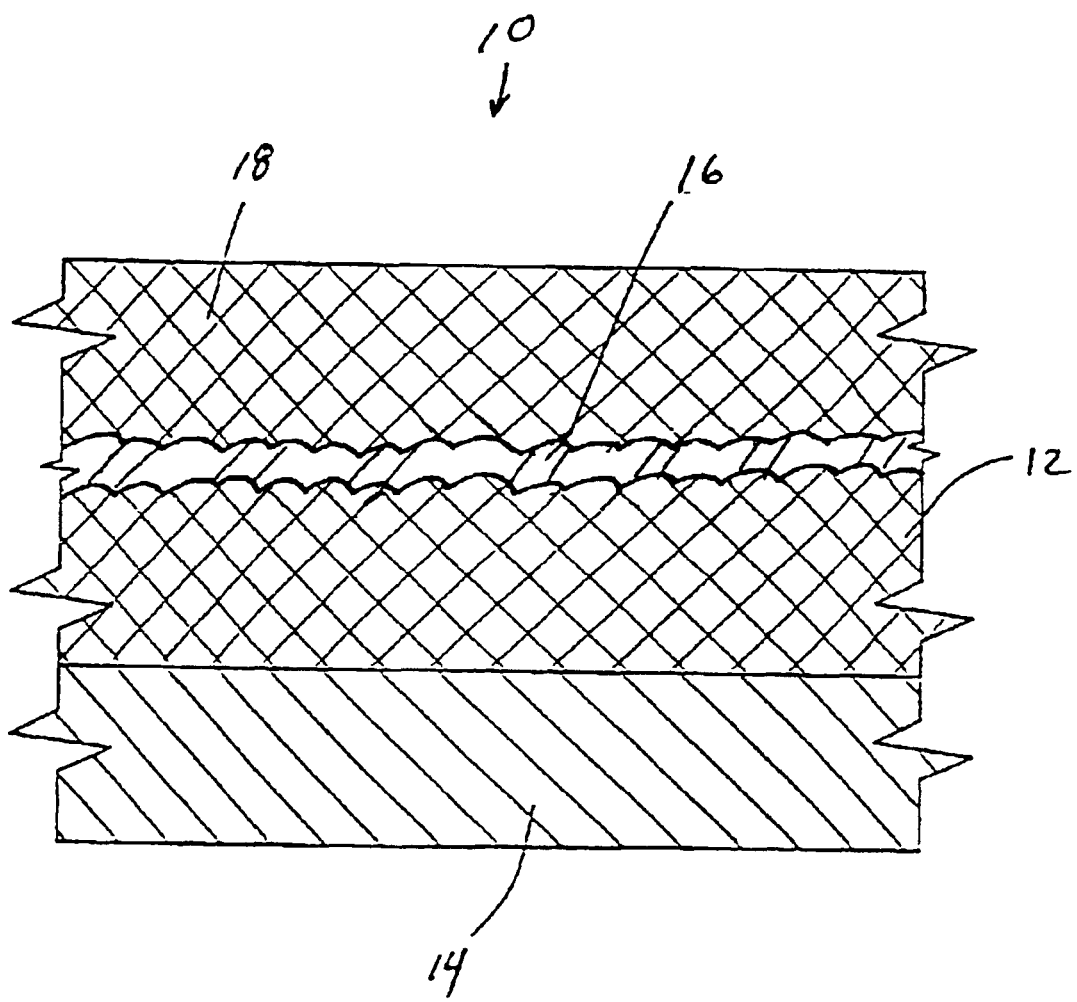
FIG. 1C shows the addition of a top plate of a capacitor over the capacitor dielectric.

Turning now to the drawings, the formation of a capacitor, generally designated by a reference numeral 10, using a rough polysilicon is shown in cross-section in FIGS. 1A through 1C. In FIG. 1A, a rough polysilicon film 12 is formed over a substrate 14. The rough polysilicon film 12 constitutes the bottom plate of the capacitor 10. In FIG. 1B, a dielectric 16 is grown or deposited on top of the rough polysilicon film 2. In FIG. 1C, a layer of conductive material 16 (e.g., polysilicon) is deposited over the dielectric 16. The conductive material 18 constitutes the top plate of the capacitor 10. In one embodiment, pulsed plasma chemical vapor deposition (CVD), using a mixture of silane gas ($SiH_4$) and argon (Ar), is used to deposit the rough polysilicon film 12 on the underlying substrate 14.

Figure 2:
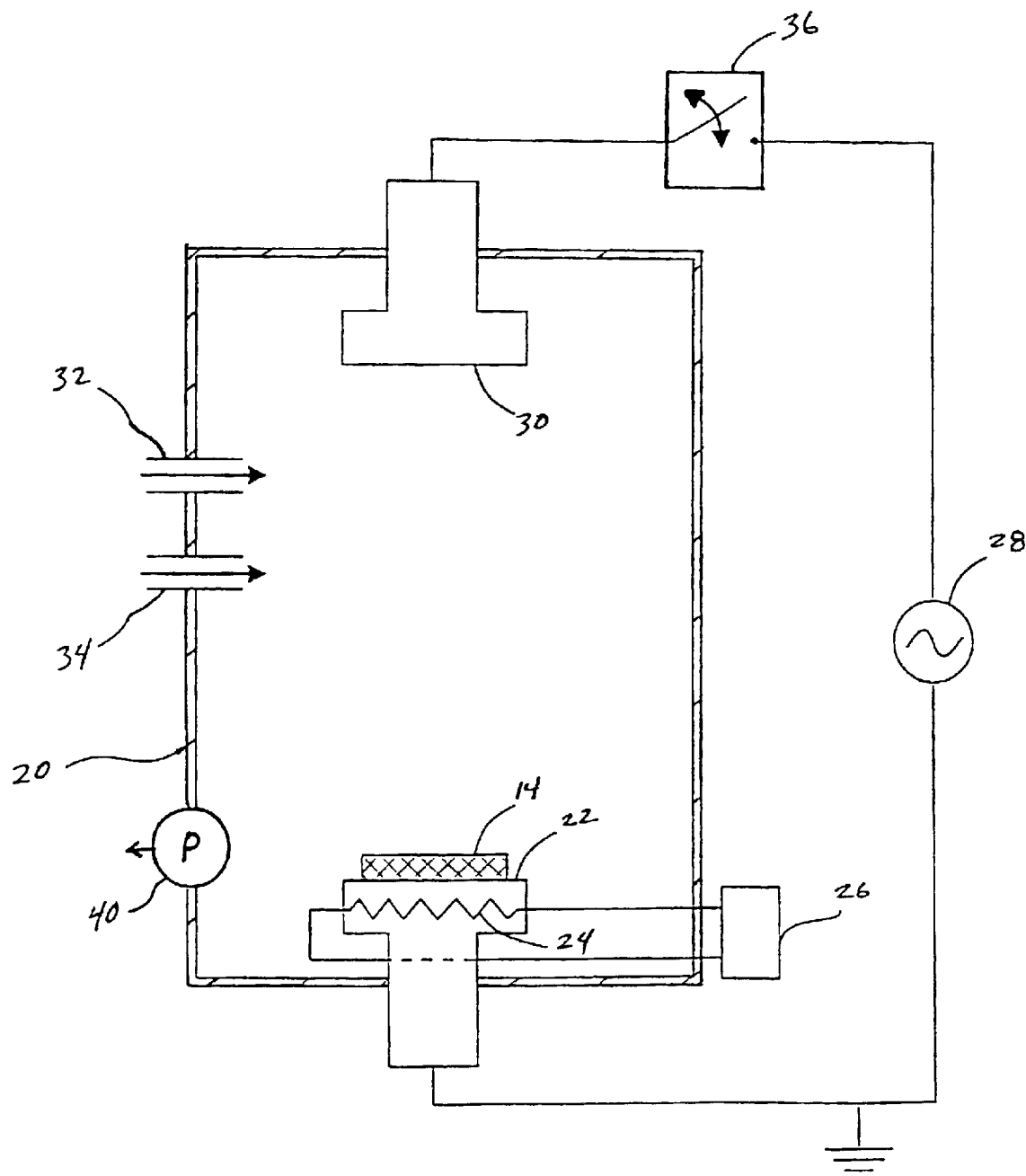
FIG. 2 is a stylized representation of a polysilicon deposition chamber.

A stylized representation of a deposition chamber 20, which can be used to practice the disclosed process, is shown in FIG. 2. The substrate 14 is shown positioned in the deposition chamber 20 atop a wafer chuck 22. A heating element 24 runs through the wafer chuck 22. The temperature of the heating element 24 may be varied by a temperature controller 26. An RF power source 20 sends an oscillating voltage at a controlled frequency to a plate 30 placed above the wafer chuck 22. The plate 30 is usually grounded to create a radio-frequency (RF) controlled plasma. The voltage that builds up between the plate 30 and the wafer chuck 22 creates an electric field inside of the deposition chamber 20. When this happens, gases that have been introduced into the chamber via a port 32 and a port 34 can become ionized so that the reactants are deposited onto the substrate 14. This is commonly referred to as "striking" or "enabling" a plasma.

More than just two gases can be introduced into the deposition chamber 20 at one time if the reaction chemistry so dictates, as one of ordinary skill will realize. A suitable deposition chamber 20 for practicing the disclosed embodiment is an Applied Materials™ model 5000D deposition chamber. This model is advantageous because it contains plasma generation capabilities. Other more standard CVD chambers, such as the Applied Material™ Centura™ model 5200 or the AG Associates™ model 8000, may also be used if modified to generate a sufficient electric field to enable a plasma.

In the disclosed embodiment, the plasma is "pulsed," meaning that the plasma is selectively enabled and disabled at various times during deposition. Pulsing of the plasma can be achieved by several means. One such method involves connecting a pulse generator 36 to the RF power source 28, as shown schematically in FIG. 2. The pulse generator 36 sends a square wave to the RF power source 28. The square wave is connected to the RF power source 28 in such a manner that the RF power source 28 is enabled during the high portions of the square wave 28 and is disabled during the low portions of the square wave. When the RF power source 28 is enabled, it sends an oscillating voltage to the plate 30 as described above, thus facilitating formation of plasma in the deposition chamber 20. When the RF power source 28 is disabled, the oscillating voltage is not sent to the plate 30. Thus, no plasma is formed during that period. It is also possible that the RF power source 28 can be enabled and disabled by the use of a computer or by the use of another appropriate switch.

For sufficient production of a rough polysilicon film, the RF power source 28, in this embodiment, is capable of producing a power in the range of 10 to 1,000 Watts and oscillates (when enabled) with a frequency of 400,000 to 15,000,000 Hertz (Hz), with 13,600,000 Hz being typical. The pulse generator 36 is capable of producing a square wave with a frequency of 25 to 1,000 Hz. The duty cycle, i.e., the percentage of the time that the square wave is high, may vary between 10% and 90%. Assuming a six-liter volume for deposition chamber 20, the following other deposition parameters are suitable for the production of a rough polysilicon film:

deposition temperature of 300 to 600 degrees Centigrade; silane gas flow rate of 5 to 500 cubic centimeters per minute; argon gas flow rate of 10 to 1000 cubic centimeters per minute; and deposition chamber pressure of 0.1 to 100 Torr.

The pulsing of the plasma has distinct advantages. First, pulsing the plasma allows for stringent control of the plasma chemistry. During the disabled portion of the plasma cycle, the reactive by-products are pumped out of the deposition chamber 20 by the pump 40, and the reaction is started anew on the next enabled cycle. If the plasma is not pulsed, the silane ions produced in the plasma will combine to form silicon which, when situated on the wafer surface, may produce a smooth film.

Another advantage of pulsing the plasma is that gas phase nucleation is generally not conducive to precise control, because nucleation size and density vary as a function of deposition time in an active plasma. By keeping the enabled time relatively short, these effects, which tend to cause the polysilicon film to grow in a random and unrepeatable fashion, are reduced. With a pulsed plasma, a constant desired concentration of reactive silane can be maintained because during the disabled state, the silane ions become neutral through recombination.

The disclosed process has other advantages as well. First, because the mean free path of the reactive species is kept to a maximum by curtailing the duration of the "enabled" portion, better polysilicon step coverage can result. This makes the disclosed process beneficial for depositing a rough polysilicon film on a three-dimensional surface, such as a contact hole, a trench, or a stack for a DRAM capacitor. In addition, rough polysilicon films using the disclosed technique can be deposited at relatively low temperatures, such as 500 degrees Centigrade. Deposition at low temperatures is beneficial because the growth of the polysilicon film on the surface of the wafer will not be dictated by the thermal mobility of the silicon atoms which dissociate from the silane ions at the wafer surface. By the use of lower deposition temperatures, a rough polysilicon film can be achieved that is largely independent of temperature. By contrast, conventional non-pulsed CVD rough polysilicon films cannot typically be deposited at such low temperatures, because the resulting film will be amorphous and, therefore, smooth.

The use of the disclosed method produces a film in which the vertical "peak-to-valley" roughness of the polysilicon film is approximately 500 Angstroms, and the lateral "peak-to-valley" roughness of the polysilicon film is approximately 500 Angstroms. However, the resulting film is a function of the various processing conditions that are discussed herein, and the process is susceptible to optimization before a film of a suitable rugosity is realized for a given application.

What is claimed is:

1. A capacitor comprising:
   a first plate comprised of a rough polysilicon film;
   a dielectric film disposed over the first plate, wherein the dielectric film has a vertical peak-to-valley roughness of approximately 500 Angstroms; and
   a second plate comprised of a conductive film disposed over the dielectric film.

2. The capacitor, as set forth in claim 1, wherein the dielectric film conforms to the rough polysilicon film to provide a roughened surface to the second plate.

3. The capacitor, as set forth in claim 1, wherein the conductive film comprises polysilicon.

4. The capacitor, as set forth claim 2, wherein the conductive film conforms to the roughened surface of the dielectric film to form a roughened surface on the second plate.

* * * * *